(12) United States Patent
Li

(10) Patent No.: US 11,836,602 B2
(45) Date of Patent: Dec. 5, 2023

(54) METHOD FOR AI-BASED CIRCUIT DESIGN AND IMPLEMENTATION SYSTEM THEREOF

(71) Applicant: BATELAB CO., LTD., Jiangsu (CN)

(72) Inventor: Zhen Li, Suzhou (CN)

(73) Assignee: BATELAB CO., LTD, Jiangsu (CN)

( * ) Notice: Subject to any disclaimer, the term of this patent is extended or adjusted under 35 U.S.C. 154(b) by 0 days.

(21) Appl. No.: 17/950,164

(22) Filed: Sep. 22, 2022

(65) Prior Publication Data

US 2023/0316049 A1    Oct. 5, 2023

Related U.S. Application Data

(63) Continuation of application No. PCT/CN2021/116291, filed on Sep. 2, 2022.

(30) Foreign Application Priority Data

Jul. 12, 2021 (CN) .......................... 202110781715.5
Jul. 12, 2021 (CN) .......................... 202110783385.3

(51) Int. Cl.
   *G06N 3/00* (2023.01)
   *G06N 3/0464* (2023.01)
   (Continued)

(52) U.S. Cl.
   CPC ......... *G06N 3/0464* (2023.01); *G06F 30/392* (2020.01); *G06N 3/08* (2013.01); *H04L 41/16* (2013.01); *H04L 45/08* (2013.01)

(58) Field of Classification Search
   CPC ...... G06N 3/0464; G06N 3/08; G06F 30/392; H04L 41/16; H04L 45/08
   See application file for complete search history.

(56) References Cited

U.S. PATENT DOCUMENTS 10,437,954 B1   10/2019   White et al.
10,699,002 B1 *  6/2020   Walters .................... G06N 3/08
(Continued)

FOREIGN PATENT DOCUMENTS

CN    103455654 A       12/2013
CN    110110905 A   *    8/2019   ........... G06N 3/0454
(Continued)

OTHER PUBLICATIONS

Research Article "Regression and ANN Models For Electronic Circuit Design"; Wiley Hindawi, vol. 2018, Article ID 7379512,; Published: Jul. 16, 2018; (https://www.hindawi.com/journals/complexity/2018/7379512/); M.I. Dieste-Velasco, et al., Electromechanical Engineering Department, University of Burgos, Burgos, Spain.

(Continued)

*Primary Examiner* — Naum Levin
(74) *Attorney, Agent, or Firm* — Taft Stettinius & Hollister LLP; Stephen F. Rost

(57) ABSTRACT

A method for circuit design based on Artificial Intelligence (AI) and an implementation system thereof. Subcircuits of a circuit-design topology of a historical phase, which are of different categories, are classified and a first feature model are obtained by training; a feature parameter of a circuit is acquired, and finally, the circuit feature parameter is compared with an expected parameter and a corresponding determination result is obtained, thereby a determination is able to be provided for the circuit design, and no simulation is required. As a result, an adjustment on the circuit design or an optimization on the circuit can be performed at a proper time, accordingly, the efficiency in design can be improved.

9 Claims, 10 Drawing Sheets

(51) Int. Cl.
*G06F 30/392* (2020.01)
*G06N 3/08* (2023.01)
*H04L 45/02* (2022.01)
*H04L 41/16* (2022.01)

(56) References Cited

U.S. PATENT DOCUMENTS

| | | | |
|---|---|---|---|
| 10,776,691 B1 * | 9/2020 | Ghahramani | G06N 3/045 |
| 2011/0301923 A1 * | 12/2011 | Tseng | G06F 30/367 |
| | | | 703/2 |
| 2013/0326441 A1 | 12/2013 | Ward | |
| 2016/0042107 A1 | 2/2016 | Fawaz et al. | |
| 2017/0330072 A1 | 11/2017 | Liao et al. | |
| 2021/0125097 A1 * | 4/2021 | Ozer | G06F 18/214 |

FOREIGN PATENT DOCUMENTS

| | | |
|---|---|---|
| CN | 110502837 A | 11/2019 |
| CN | 113239651 A | 8/2021 |
| WO | 2019200626 A1 | 10/2019 |
| WO | 2020108483 A1 | 6/2020 |
| WO | 2020185207 A1 | 9/2020 |
| WO | WO-2020185207 A1 * | 9/2020 ............. G06F 30/27 |

OTHER PUBLICATIONS

International Searching Authority, China (ISA/CN); English Translation of the International Search Report; International Application No. PCT/CN2021/116291; dated Apr. 14, 2022; pp. 1-2; Officer: Wang Ping.
International Searching Authority, China (ISA/CN); Written Opinion of the ISA; International Application No. PCT/CN2021/116291; dated Apr. 14, 2022; pp. 1-5.
China Intellectual Property Administration (ISA/CN), Beijing China; Written Opinion of the International Searching Authority; dated Apr. 14, 2022; pp. 1-4; Officer: Ping Wang.
China Intellectual Property Administration (ISA/CN), Beijing China; International Search Report of corresponding application PCT/CN2021/116291; pp. 1-2; dated Apr. 14, 2022.
China National Intellectual Property Administration (CNIPA); First Office Action of corresponding CN application No. 202110783385.3; dated Jan. 19, 2023; pp. 1-2.

* cited by examiner

METHOD FOR AI-BASED CIRCUIT DESIGN AND IMPLEMENTATION SYSTEM THEREOF

CROSS-REFERENCE TO RELATED APPLICATIONS

This application is a continuation of International Application No. PCT/CN2021/116291 filed on Sep. 2, 2022, which claims priority to Chinese Patent Application No. 202110781715.5 filed on Jul. 12, 2021 and Chinese Patent Application No. 202110783385.3 filed on Jul. 12, 2021, the disclosures of which are hereby incorporated by reference in their entireties.

TECHNICAL FIELD

The present application relates to the field of circuit design, and specifically relates to a method for AI-based circuit design and an implementation system thereof.

BACKGROUND

Regarding the existing methods of circuit design, active circuits that are composed of semiconductor devices such as a switch diode/switch transistor, etc. are all designed by R&D (Research and Development) personnel according to their experiences. However, owing to the complexity and variety of circuit structure and device parameters, when designing a circuit, R&D personnel typically uses the electronic design automation (EDA) software to design a circuit and perform a simulation to verify the correctness of the design, wherein during the continuous modification on the circuit, there exist the problem of going in a wrong direction of modification and the problem of long simulation time, which leads to a time-consuming, labor-intensive and low-efficiency circuit design. And hundreds of times of adjustments and improvements performed on circuit structure or parameters would result in low efficiency of circuit design.

SUMMARY OF THE INVENTION

In light of this, embodiments of the present application provide a method for AI-based circuit design and an implementation system thereof, which are helpful in solving problems that exist in the related art.

According to a first aspect, provided in the present application is an AI (Artificial Intelligence) implementation method used for circuit design, which includes: acquiring a circuit-design topology of a historical phase, the circuit-design topology being composed of a plurality of topologies of subcircuits; building up a convolutional neural network for training the circuit-design topology; inputting the topologies of subcircuits of each category into the convolutional neural network to obtain a first feature model by training; inputting a being-designed circuit topology into the first feature model to obtain a circuit feature parameter; and comparing the circuit feature parameter with an expected parameter and obtaining a corresponding determination result.

In addition, the inputting the topologies of subcircuits of each category into the convolutional neural network to obtain a first feature model by training, may specifically include: dividing the circuit-design topology into the plurality of topologies of subcircuits, and classifying the plurality of topologies of subcircuits according to functional names included in the functional parameters of the subcircuits; constructing a sample database, the sample database including functional parameters of the subcircuits, a name of each circuit element of the topologies of subcircuits, and connection relationships among each other of the circuit elements; and acquiring and inputting data in the sample database into the convolutional neural network to obtain the first feature model by training.

In addition, the name of each circuit element of the topologies of subcircuits and the connection relationships among each other of the circuit elements may be stored in the sample database in a form of a first matrix, and there may be a node disposed between adjacent circuit elements. Each of the circuit elements may include a connection point connected to the node. An entry $X_{ij}$ that is in an i-th row and a j-th column of the first matrix represents a circuit element $A_{abk}$ which is located between node i and node j, "A" representing a type of the circuit element, "a" representing a first connection point that is connected to node i, "b" representing a second connection point that is connected to node j, and "k" representing this element is a k-th type A element.

In addition, the sample database may further include a second matrix. The second matrix may be used for storing subcircuits in the circuit-design topology. For an entry Y that is in an m-th row and an n-th column of the second matrix, the m-th row represents a serial number corresponding to a circuit name of a certain subcircuit, the n-th column represents the number of times of storing all the subcircuits, and a value of Y is 0 or 1 wherein 0 represents that a circuit topology of the certain subcircuit is identical to a previously stored topology of subcircuit while 1 represents that the functional parameter of the circuit topology of the certain subcircuit is different from that of the previously stored topology of subcircuit.

In addition, the functional parameters may further include a design phase of the circuit design, a range of an input voltage, a range of an output voltage, a temperature-dependent drift rate of the output voltage, a voltage drift rate of the output voltage and a static operating current or an output frequency.

In addition, the acquiring and inputting data in the sample database into the convolutional neural network to obtain the first feature model by training may specifically include: constructing a sample set according to the sample database; dividing the sample set randomly into a training sample subset and a testing sample subset; reading out data in the training sample subset, and inputting the training sample subset into the convolutional neural network in several batches to perform a training operation; adjusting, in a training process, a network parameter weight of the convolutional neural network to obtain a first neural network model that has been trained; inputting the testing sample subset into the first neural network model to perform a validation operation so as to obtain a validation result; and optimizing the first neural network model according to the validation result to obtain the first feature model.

In addition, the inputting the testing sample subset into the first neural network model to perform a validation operation so as to obtain a validation result may specifically include: inputting x testing samples into the first neural network model to acquire x first results; comparing the x first results with functional parameters of the x testing samples, counting an amount y of samples having an absolute value of a difference between the corresponding first result and the functional parameter of the testing sample being greater than a threshold value; calculating the validation result, the validation result being a ratio of the amount y to the total amount x of the testing samples.

In addition, the comparing the circuit feature parameter with an expected parameter and obtaining a corresponding determination result may specifically include: determining the being-designed circuit topology design to be qualified when an absolute value of a difference between the circuit feature parameter and the expected parameter is less than a parameter threshold value; and determining the being-designed circuit topology to be unqualified when an absolute value of a difference between the circuit feature parameter and the expected parameter is greater than a parameter threshold value.

In addition, an entire designing process of one circuit-design topology may be a designing cycle. The designing cycle may include a plurality of successive sub-designing phases. At the step of inputting the topologies of subcircuits of each category into the convolutional neural network to obtain a first feature model by training, input labels of the subcircuits may include sub-designing phases corresponding to each topology of subcircuit. At the step of inputting a being-designed circuit topology into the first feature model to obtain a circuit feature parameter, the feature parameter may include the sub-designing phase of each subcircuit in the being-designed circuit topology.

According to a second aspect, further provided in the present application is an AI implementation system used for circuit design, which, as a system for determining a circuit design, includes: an acquisition module, for acquiring a circuit-design topology of a historical phase, the circuit-design topology being composed of a plurality of topologies of subcircuits; a building-up module, for building up a convolutional neural network for training the circuit-design topology; a training module, for inputting the topologies of subcircuits of each category into the convolutional neural network to obtain a first feature model by training; an output module, for inputting a being-designed circuit topology into the first feature model to obtain a circuit feature parameter; and a comparison module, for comparing the circuit feature parameter with an expected parameter and obtaining a corresponding determination result.

According to a third aspect, provided in the present application is an AI implementation system used for circuit design, which includes: a storage module, for classifying and storing topologies of subcircuits of a circuit-design topology of a historical phase, a type of the classifying being according to a functionality of each topology of subcircuit; a generator computing module, for performing, according to all of stored circuit design diagrams, an AI training to obtain a circuit generation model; a trainer computing module, for performing, according to the all of stored circuit design diagrams, an AI training to obtain a determination model; a first input module, for inputting a being-designed circuit design diagram and a first target functional parameter; a generation module, for acquiring the being-designed circuit design diagram and the first target functional parameter, and obtaining, on the basis of the circuit generation model, a first target circuit design diagram; an output module, for outputting the first target circuit design diagram; a second input module, for inputting a second target functional parameter; and a determination module, for acquiring the first target circuit design diagram and the second target functional parameter, performing, on the basis of the determination model, a determination with regard to the first target circuit design diagram and the second target functional parameter so as to obtain a first result, generating a training instruction, and outputting the training instruction to the generation module, wherein the generation module acquires the training instruction and retrains the circuit generation model on the basis of the training instruction.

In addition, the AI implementation system used for circuit design may further include: a sample database constructing module, for constructing, according to the all of stored circuit design diagrams, a sample database and inputting the sample database into the trainer computing module, the sample database including functional parameters of the subcircuits, a name of each circuit element of the topologies of sub circuits, and electrical connection relationships among each other of the circuit elements.

In addition, the sample database constructing module may include: a dividing unit, for dividing the circuit-design topology into the plurality of topologies of subcircuits, and classifying the plurality of topologies of subcircuits according to functional names included in the functional parameters of the sub circuits; and a construction unit, for storing the functional parameters of the subcircuits, a name of each circuit element of the topologies of subcircuits, and the electrical connection relationships among each other of the circuit elements into the sample database.

In addition, a name of each circuit element of the topologies of subcircuits, and the electrical connection relationships among each other of the circuit elements may be stored in the sample database in a form of a first matrix, wherein there is a node disposed between adjacent circuit elements. Each of the circuit elements may include a connection point connected to the node. An entry $X_{ij}$ that is in an i-th row and a j-th column of the first matrix represents a circuit element $A_{abk}$ which is located between node i and node j, wherein "A" represents a type of the circuit element, "a" represents a first connection point that is connected to node i, "b" represents a second connection point that is connected to node j, and "k" represents this element is a k-th type A element.

In addition, the sample database may further include a second matrix. The second matrix may be used for storing subcircuits in the circuit-design topology. For an entry Y that is in an m-th row and an n-th column of the second matrix, the m-th row represents a serial number corresponding to a circuit name of a certain subcircuit, the n-th column represents a sub-designing phase of a subcircuit, and a value of Y is 0 or 1 wherein 0 represents that a circuit topology of the certain subcircuit is identical to a previously stored topology of subcircuit while 1 represents that the functional parameter of the circuit topology of the certain subcircuit is different from that of the previously stored topology of subcircuit.

In addition, the functional parameters may further include a design phase of the circuit design, a range of an input voltage, a range of an output voltage, a temperature-dependent drift rate of the output voltage, a voltage drift rate of the output voltage and a static operating current or an output frequency.

In addition, numerical values of the first target functional parameter and the second target functional parameter may be equal. The first target functional parameter and the second target functional parameter may each include a range of an input voltage, a range of an output voltage, a temperature-dependent drift rate of the output voltage, a voltage drift rate of the output voltage and a static operating current or an output frequency.

In addition, the trainer computing module may include a sample set constructing unit, for constructing a sample set according to the sample database; a sample set dividing unit, for dividing the sample set randomly into a training sample subset and a testing sample subset; a reading-out unit, for reading out data in the training sample subset and inputting the training sample subset into a neural network to perform a training operation; a first neural network model constructing unit, for adjusting, in a training process, a network parameter weight of the neural network to obtain a first neural network model that has been trained; a validating unit, for inputting the testing sample subset into the first neural network model to perform a validation operation so as to obtain a validation result; and an optimization unit, for optimizing the first neural network model according to the validation result to obtain the determination model.

In addition, the validating unit may include an input subunit, for inputting x testing samples into the first neural network model to acquire X first results; a counting subunit, for comparing the x first results with the x testing samples, counting an amount y of samples having an absolute value of a difference between the corresponding first result and the functional parameter of the testing sample being greater than a threshold value; and a calculation subunit, for calculating a first validation result, the first validation result being a ratio of the amount y to the total amount x of the testing samples.

According to a forth aspect, provided in the present application is an AI implementation method for circuit design, which includes: storing a circuit-design topology of a historical phase, the circuit-design topology being composed of a plurality of topologies of subcircuits; performing, according to all of stored circuit design diagrams, an AI training to obtain a circuit generation model; performing, according to the all of stored circuit design diagrams, an AI training to obtain a determination model; inputting a being-designed circuit design diagram and a first target functional parameter into the circuit generation model to obtain a first target circuit design diagram; performing, on the basis of the determination model, a determination with regard to the first target circuit design diagram and a second target functional parameter to obtain a first result, and generating a training instruction; and inputting the training instruction into the circuit generation model, and retraining the circuit generation model on the basis of the training instruction.

The technical solutions of the present application have the following advantages:

In the AI implementation method for circuit design provided in the present application, subcircuits of a circuit-design topology of a historical phase, which are of different categories, are classified and input into a convolutional neural network to obtain a first feature model by training, a being-designed circuit topology is input into the first feature model to obtain a circuit feature parameter, and finally, the circuit feature parameter are compared with an expected parameter, and then a corresponding determination result is obtained, thereby a determination is able to be provided for the circuit design, and no simulation is required, which enables the designer to perform an adjustment on the circuit design or an optimization on the circuit at a proper time, and accordingly to improve the efficiency in design.

Provided in the present application is a sample database, wherein connection relationships among subcircuits are represented in a form of a first matrix, storage statuses of the subcircuits of a circuit-design topology of a historical phase are recorded, and the circuit-design topology is trained, thereby the topological structure of the subcircuits can be accurately described, and accordingly the accuracy of training can be improved. Besides, the amount of data is small when being stored in the form of the first matrix, and therefore, the speed of training can be improved as well.

In the training process of the present application, training labels include sub-designing phases corresponding to each topology of subcircuit, and are input into a convolutional neural network to obtain a second feature model by training, therefore the second feature model outputs the sub-designing phase of each subcircuit in the being-designed circuit topology. Finally, the sub-designing phase output by the second feature model is compared with the actual sub-designing phase of the subcircuit, and would be determined to be illogical if it is different from the actual sub-designing phase, thereby being able to provide a suggestion of optimization to the designer, and accordingly improving the work efficiency. Sub-designing phases of the subcircuits are represented in a form of a second matrix, thereby the speed of training can be improved.

In the present application, subcircuits of a circuit-design topology of a historical phase, which are of different categories, are classified and stored, and are input into a generator computing module and a trainer computing module to respectively obtain a circuit generation model and a determination model, then a being-designed circuit-design topology and a first target functional parameter are input into the generation module, a first target circuit design diagram is obtained by the generation module on the basis of the circuit generation model, and the first target circuit design diagram is output by an output module, thereby being able to provide a reference design scheme for a being-designed circuit to R&D personnel, and accordingly improving the efficiency in design.

In addition, the determination module may acquire the first target circuit design diagram and a second target functional parameter, perform, on the basis of the determination model, a determination with regard to the first target circuit design diagram and the second target functional parameter, and then obtain a first result, generate a training instruction, and output the training instruction into the generation module. The generation module may retrain the circuit generation model on the basis of the training instruction. No simulation is required for the retraining, and therefore the speed of training is fast.

BRIEF DESCRIPTION OF THE DRAWINGS

For more clearly illustrating the technical solutions in detailed embodiments of the present application or in the related art, the accompanying drawings, which are needed for describing the detailed embodiments or the related art, will be briefly introduced hereinafter. Apparently, the accompanying drawings described below refer to some embodiments of the present application, and other drawings can be acquired on the basis of the accompanying drawings illustrated herein, by those skilled in the art without making any creative effort.

DETAILED DESCRIPTION OF EMBODIMENTS

A description of technical solutions of the present application will be presented in a clear and complete fashion hereinafter by reference to the accompanying drawings, in order to make the purposes, technical solutions and advantages of the embodiments of the present application more clear. Apparently, the embodiments described herein are not all but some of the embodiments of the present application. Any other embodiment that can be acquired, on the basis of the embodiments described in the present application, by those skilled in the art without making any creative effort, shall be encompassed within the scope of protection of the present application.

Embodiment 1

Figure 1:
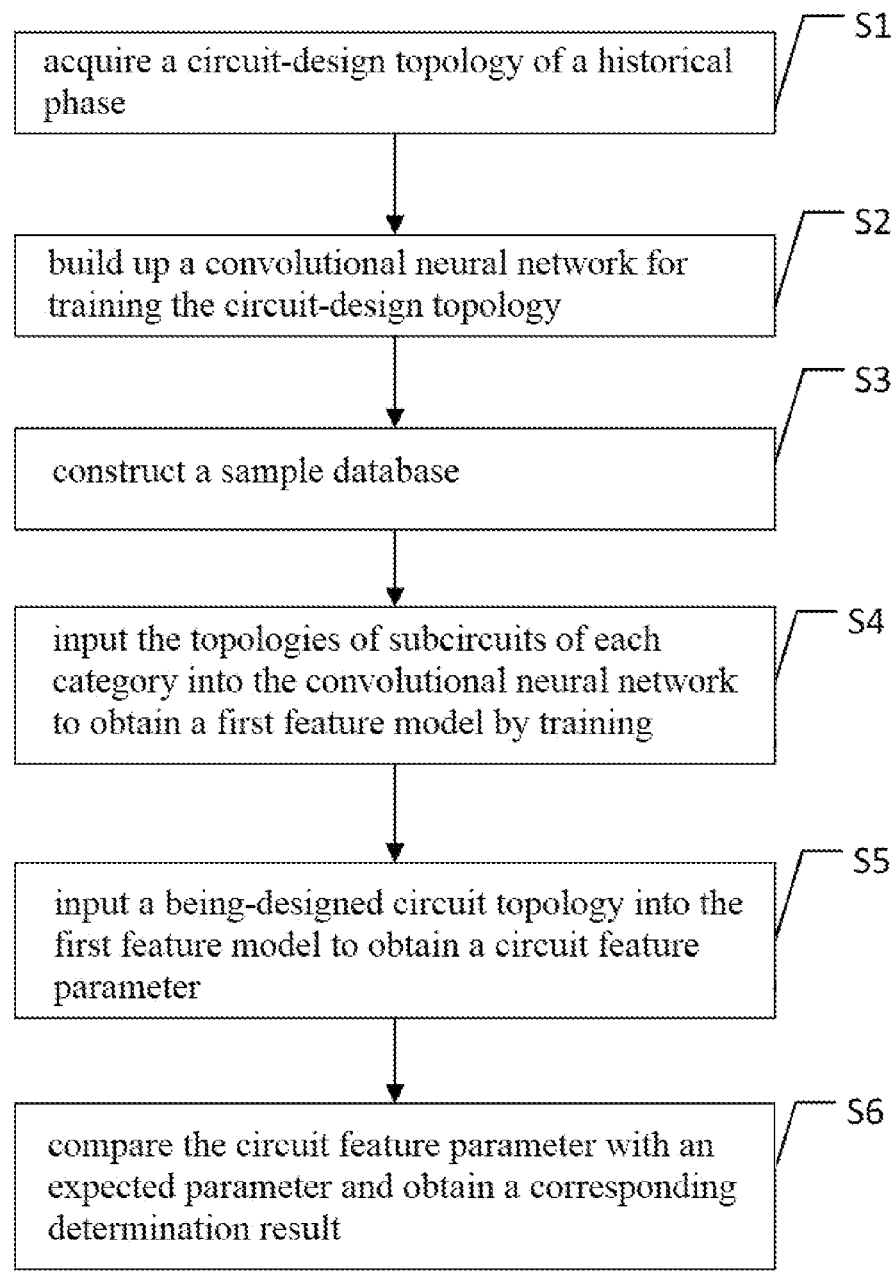
FIG. 1 is a flowchart of an AI implementation method for circuit design provided by an embodiment of the present application.

As shown in FIG. 1, provided in the present application is an AI implementation method for circuit design, which is utilized in a circuit development platform wherein all records of modification on a circuit-design topology are automatically stored each time R&D personnel clicks on the storage button. To be specific, the code for the storage button is modified, that is, after a file is actually stored, and before the program returns to other codes, such as a code for editing and a code for closing, a line of program is inserted therein to store the netlist file corresponding to the just stored file into a code repository, thereby implementing the storage of historical versions of a file efficiently. The AI implementation method for circuit design includes Steps S1 to S6 as follows.

At Step S1, acquire a circuit-design topology of a historical phase. The circuit-design topology is composed of a plurality of topologies of subcircuits. The circuit-design topology of a historical phase includes a complete circuit-design topology in the first design cycle. A topology of subcircuit includes an active circuit.

At Step S2, build up a convolutional neural network for training the circuit-design topology. Convolutional neural networks (CNN) are a kind of feedforward neural networks with convolution computation and depth structure. It is one of the representative algorithms of deep learning. The convolutional neural network is capable of representation learning and shift-invariant classification of input information according to its hierarchical structure. For this reason, it is also known as "Shift-Invariant Artificial Neural Networks (SIANN)".

Figure 2:
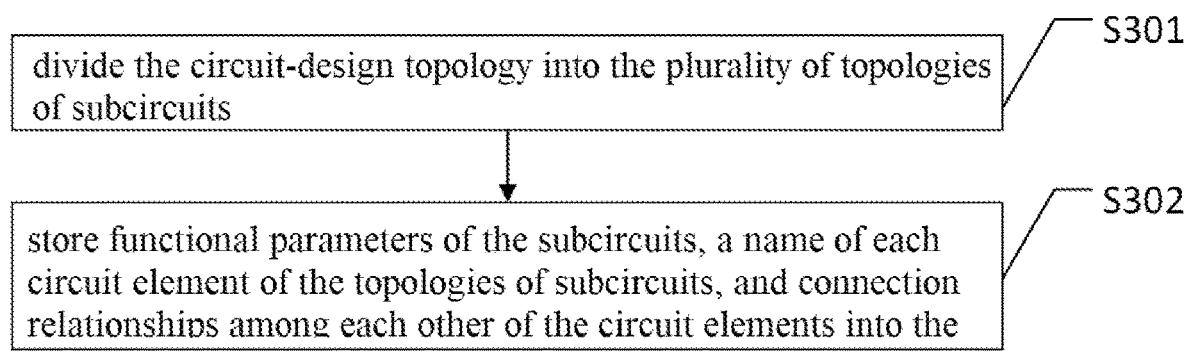
FIG. 2 is a flowchart of an AI implementation method for circuit design provided by an embodiment of the present application.

At Step S3, construct a sample database. The sample database includes functional parameters of the subcircuits, a name of each circuit element of the topologies of subcircuits, and connection relationships among each other of the circuit elements. As shown in FIG. 2, Step S3 specifically includes Steps S301 to S302 as follows.

At Step S301, divide the circuit-design topology into the plurality of topologies of subcircuits, and classify the plurality of topologies of subcircuits according to functional names included in the functional parameters of the subcircuits.

At Step S302, store functional parameters of the subcircuits, a name of each circuit element of the topologies of subcircuits, and connection relationships among each other of the circuit elements into the sample database.

As shown in TABLE 1, the name of each circuit element of the topologies of subcircuits and the connection relationships among each other of the circuit elements are stored in the sample database in a form of a first matrix. And there is a node disposed between adjacent circuit elements. Each of the circuit elements includes a connection point connected to the node. An entry $X_{ij}$ that is in an i-th row and a j-th column of the first matrix represents a circuit element $A_{abk}$ which is located between node i and node j, wherein "A" represents a type of the circuit element, "a" represents a first connection point that is connected to node i, "b" represents a second connection point that is connected to node j, and "k" represents this element is a k-th type A element. In the present application, for the training of the first matrix, the time of training can be shortened. In the present application, connection relationships in a circuit are accurately described by the first matrix, thereby providing higher accuracy in model training.

Figure 3:
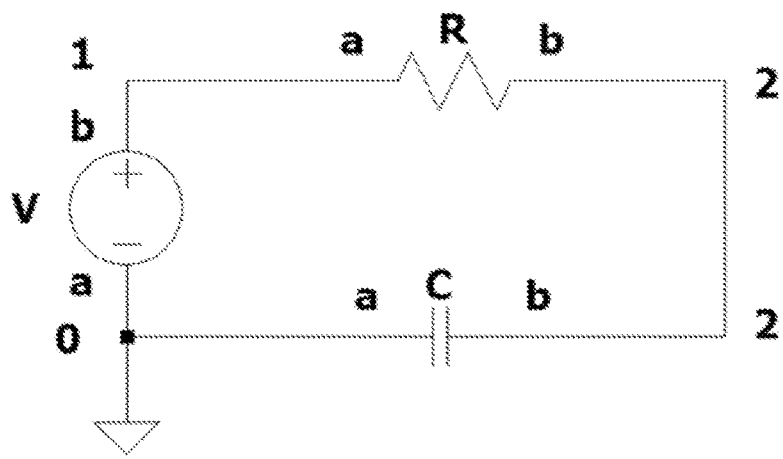
FIG. 3 is a circuit diagram of a topology of subcircuit provided by an embodiment of the present application.

As shown in FIG. 3, for example, in an RC circuit topology which contains a voltage source, each node of the subcircuit in the drawing is numbered. The node at the grounding of the subcircuit is node 0 by default. The numbering is started from node 1 rather than node 0 when there is no grounding. Node numbers are used as the row numbers and the column numbers in the matrix to create a table, then the table is filled with all of the elements to obtain the first matrix, thereby being able to link the actual connection relationships in the circuit to the first matrix.

TABLE 1 a storage table of the first matrix

| node number | 0 | 1 | 2 |
|---|---|---|---|
| 0 | 0 | $V_{ab1}$ | $C_{ab1}$ |
| 1 | $V_{ba1}$ | 0 | $R_{ab1}$ |
| 2 | $C_{ba1}$ | $R_{ba1}$ | 0 |

In the table, the entry of $X_{10}$ is $V_{ba1}$ which represents a circuit element V that is located between node 1 and node 0, wherein the connection point b of the circuit element V is connected to node 1, the connection point a of the circuit element V is connected to node 0, and the number of times a circuit element appears in the circuit is assumed to be 1 by default.

The functional parameters further include a design phase of the circuit design, a range of an input voltage, a range of an output voltage, a temperature-dependent drift rate of the output voltage, a voltage drift rate of the output voltage and a static operating current or an output frequency, etc.

Different subcircuits have different functional parameters. For example, functional parameters of a subcircuit of a bandgap reference voltage source may include a range of an input voltage, an output voltage, a temperature-dependent drift rate of the output voltage, a voltage drift rate of the output voltage and a static operating current, etc. while in an oscillating circuit, associated parameters are parameters related to the output frequency. Accordingly, in the present application, subcircuits of different functionalities are classified before training, wherein circuit topology of a subcircuit is an input and a corresponding functional parameter is an output.

At Step S4, input the topologies of subcircuits of each category into the convolutional neural network to obtain a first feature model by training.

Figure 4:
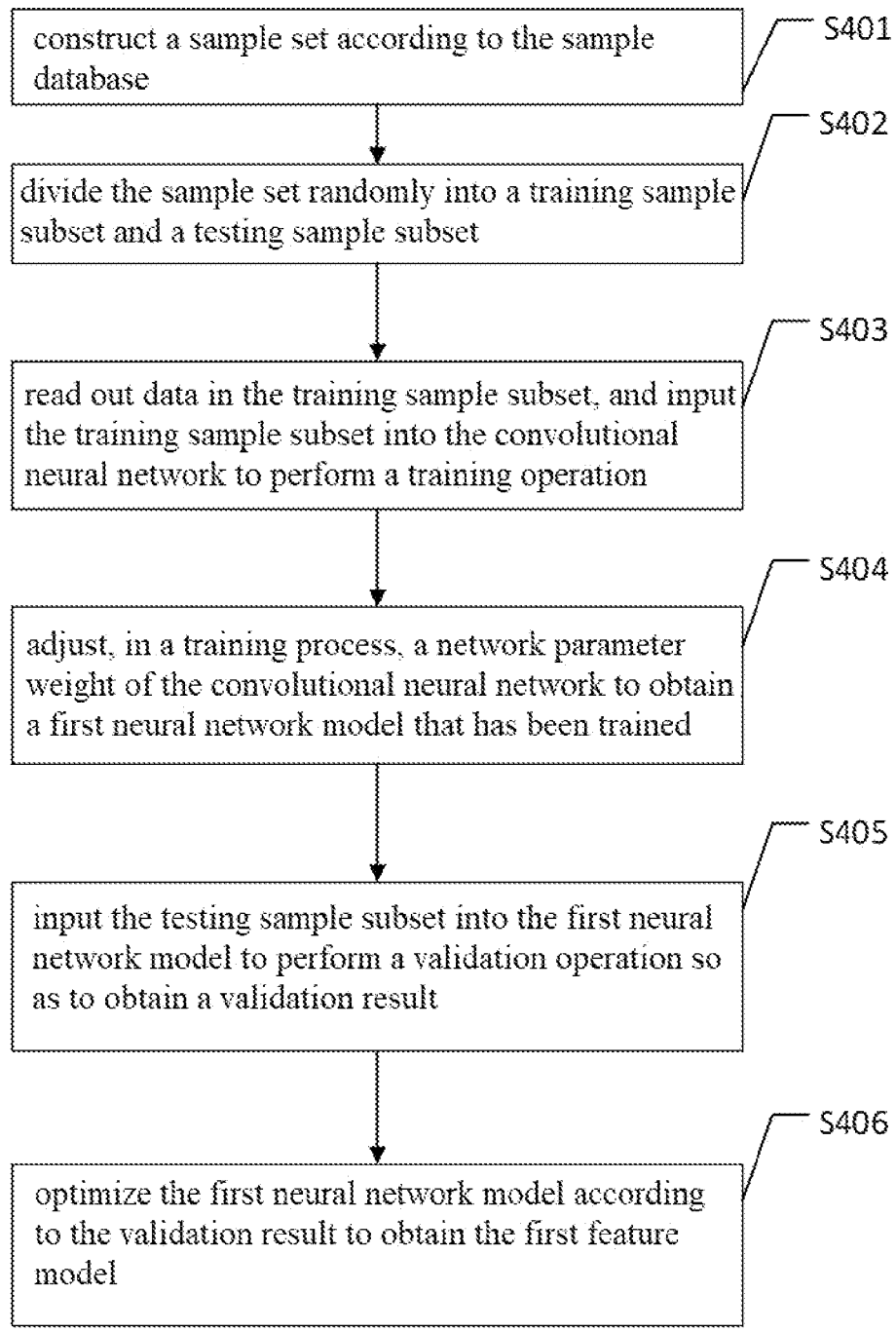
FIG. 4 is a flowchart of an AI implementation method for circuit design provided by an embodiment of the present application.

As shown in FIG. 4, Step S4 specifically includes Steps S401 to S405 as follows.

At Step S401, construct a sample set according to the sample database.

At Step S402, divide the sample set randomly into a training sample subset and a testing sample subset.

At Step S403, read out data in the training sample subset, and input the training sample subset into the convolutional neural network in several batches to perform a training operation.

At Step S404, adjust, in a training process, a network parameter weight of the convolutional neural network to obtain a first neural network model that has been trained.

Figure 5:
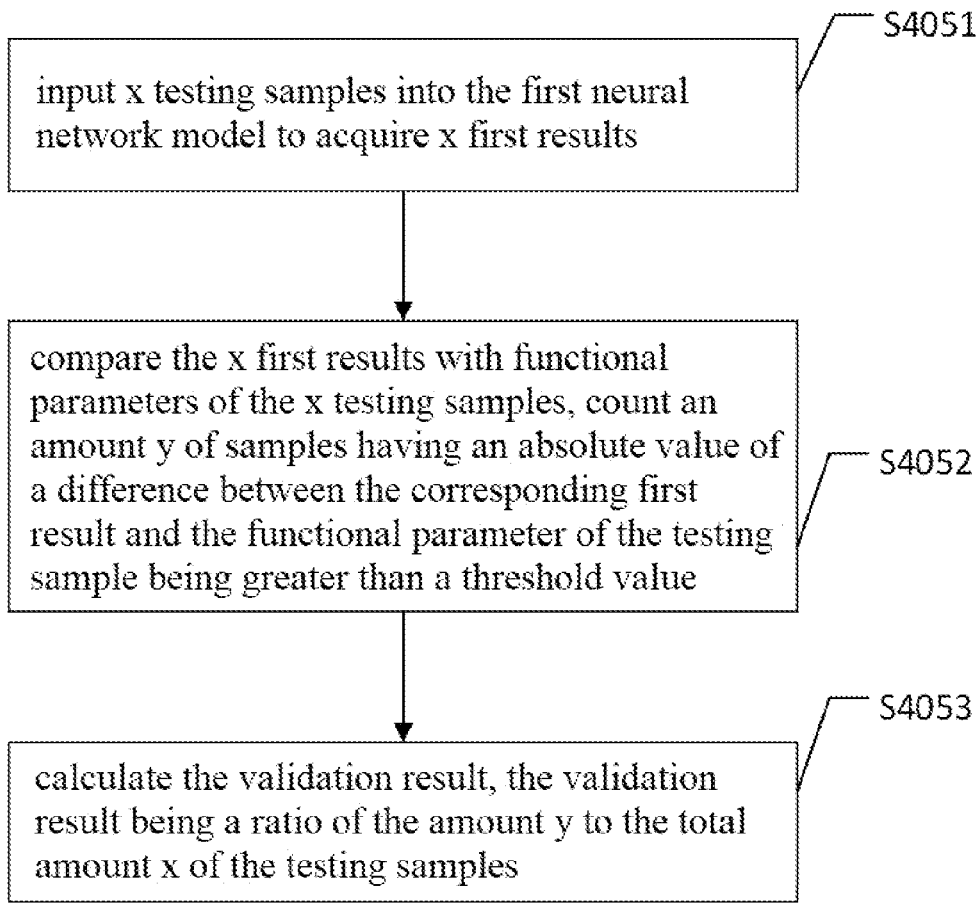
FIG. 5 is a flowchart of an AI implementation method for circuit design provided by an embodiment of the present application.

At Step S405, input the testing sample subset into the first neural network model to perform a validation operation so as to obtain a validation result. As shown in FIG. 5, Specifically, Step S3035 specifically includes Steps S4051 to S4053 as follows.

At Step S4051, input x testing samples into the first neural network model to acquire x first results. The first result is a predicted functional parameter.

At Step S4052, compare the x first results with functional parameters of the s testing samples, count an amount y of samples having an absolute value of a difference between the corresponding first result and the functional parameter of the testing sample being greater than a threshold value.

At Step S4053, calculate the validation result. The validation result that is calculated is a ratio of the amount y to the total amount x of the testing samples.

At Step S406, optimize the first neural network model according to the validation result to obtain the first feature model.

At Step S5, input a being-designed circuit topology into the first feature model to obtain a circuit feature parameter. the output feature parameters include a design phase of the circuit design, a range of an input voltage, a range of an output voltage, a temperature-dependent drift rate of the output voltage, a voltage drift rate of the output voltage and a static operating current or an output frequency, etc. The output feature parameters correspond to the functional parameters.

At Step S6, compare the circuit feature parameter with an expected parameter and obtain a corresponding determination result.

Step S6 specifically is, determining the being-designed circuit topology design to be qualified when an absolute value of a difference between the circuit feature parameter and the expected parameter is less than a parameter threshold value, and determining the being-designed circuit topology to be unqualified when an absolute value of a difference between the circuit feature parameter and the expected parameter is greater than a parameter threshold value.

A new topology of subcircuit may appear each time a cycle of design is finished, accordingly, in order to guarantee the integrity of data, the complete circuit-design topology within the second cycle of design is stored, then, the sample data of the complete circuit-design topology within the second cycle of design is input into the convolutional neural network to perform a retraining, and the first feature model is updated. The sample data of the complete circuit-design topology within the second cycle of design may include functional parameters of subcircuits, a name of each circuit element of the topologies of subcircuits and connection relationships among each other of the circuit elements. Preferably, the name of each circuit element of the topologies of subcircuits and the connection relationships among each other of the circuit elements may be stored in the sample database in a form of a third matrix, wherein the way of storage of the third matrix is the same as that of the first matrix, which is applicable to the succeeding matrices likewise.

In an embodiment, an entire designing process of one circuit-design topology is a designing cycle. The designing cycle includes a plurality of successive sub-designing phases. Typically, the sub-designing phases are numbered in chronological order, i.e., 1 to n, so as to labeling a subcircuit in different sub-designing phases.

As shown in TABLE 2, the sample database further includes a second matrix. The second matrix is used for storing subcircuits in the circuit-design topology. For an entry Y that is in an m-th row and an n-th column of the second matrix, the m-th row represents a serial number corresponding to a circuit name of a certain subcircuit, and the n-th column represents a sub-designing phase of a subcircuit, and a value of Y is 0 or 1 wherein 0 represents that a circuit topology of the certain subcircuit is identical to a previously stored topology of subcircuit while 1 represents that the functional parameter of the circuit topology of the certain subcircuit is different from that of the previously stored topology of subcircuit. The circuit name of a subcircuit is a functional name. In the present application, for the training of the second matrix, the time of training can be shortened.

TABLE 2 a storage table of the second matrix

|   | 0 | 1 | 2 | ... | 192 | 193 | 194 | ... | n − 1 | n |
|---|---|---|---|-----|-----|-----|-----|-----|-------|---|
| 1 | 1 | 1 | 1 | ... | 0 | 1 | 0 | ... | 0 | 0 |
| 2 | 0 | 0 | 0 | ... | 1 | 1 | 1 | ... | 0 | 0 |
| ... | ... | ... | ... | ... | ... | ... | ... | ... | ... | ... |
| m | 0 | 0 | 0 | ... | 0 | 0 | 0 | ... | 0 | 0 |

In TABLE 2, Row 1 to Row m respectively represent functional names of different subcircuits, for example, the first row represents a bandgap reference voltage source, the second row represents an oscillator, the m-th row represents a top layer connection, n is the total number of the stored sub-designing phases of the entire circuit-design topology.

Provided in the present application is an AI implementation method for circuit design, which further include steps as follows.

At Step S7, input the second matrix into the convolutional neural network to obtain a second feature model by training. Step S403 can be referred to as the training method at Step S7, and thus details thereof are omitted herein.

At Step S8, input a being-designed circuit topology into the second feature model to obtain a subcircuit designing phase.

At Step S9, compare the subcircuit designing phase with the actual sub-designing phase to obtain a corresponding determination result.

Finally, the sub-designing phase output by the second feature model is compared with the actual sub-designing phase of the subcircuit, and would be determined to be illogical if it is different from the actual designing phase, thereby being able to provide a suggestion of optimization to the designer. After the complete circuit-design topology within the second cycle of design is stored, then, according to the complete circuit-design topology within the second cycle of design, a new functional name of a subcircuit in the complete circuit-design topology within the second cycle of design is updated into the second matrix, the updated second matrix is input into the convolutional neural network to perform a retraining, and the second feature model is updated, wherein the process is applicable to the succeeding cycles likewise.

In the present application, subcircuits of a circuit-design topology of a historical phase, which are of different categories, are classified and input into a convolutional neural network to obtain a first feature model by training, a being-designed circuit topology is input into the first feature model to obtain a circuit feature parameter, and finally, the circuit feature parameter are compared with an expected parameter, and then a corresponding determination result is obtained, thereby a determination is able to be provided for the circuit design, and no simulation is required, which enables the designer to perform an adjustment on the circuit design or an optimization on the circuit at a proper time, and accordingly improving the efficiency in design.

In the training process of the present application, input labels of the subcircuits include sub-designing phases corresponding to each topology of subcircuit, and are input into a convolutional neural network to obtain a second feature model by training, therefore the second feature model outputs the sub-designing phase of each subcircuit in the being-designed circuit topology. Finally, the sub-designing phase output by the second feature model is compared with the actual sub-designing phase of the subcircuit, and would be determined to be illogical if it is different from the actual sub-designing phase, thereby being able to provide a suggestion of optimization to the designer, and accordingly improving the work efficiency.

Embodiment 2

Figure 6:
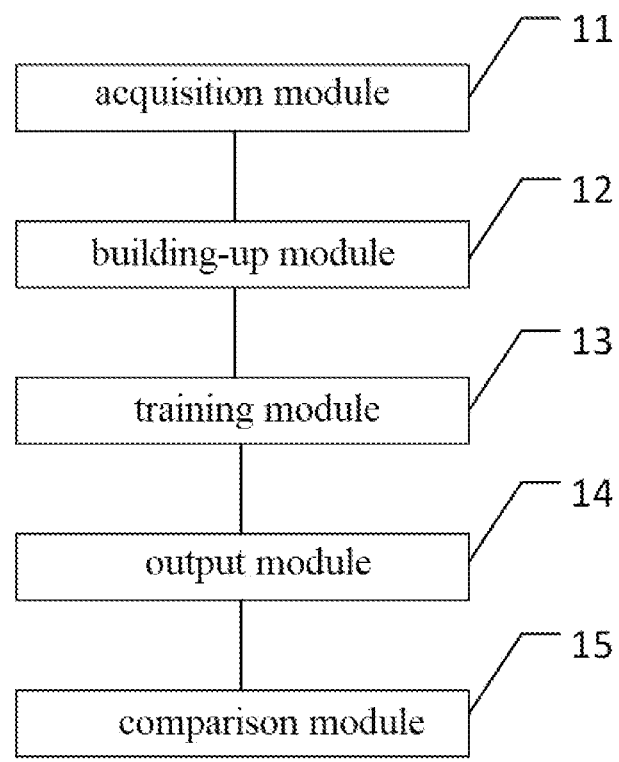
FIG. 6 is a structural block diagram of an AI implementation system for circuit design provided by an embodiment of the present application.

As shown in FIG. 6, provided in the present application is an AI implementation system used for circuit design, which includes an acquisition module 11, a building-up module 12, a training module 13, an output module 14 and a comparison module 15.

The acquisition module 11 is used for acquiring a circuit-design topology of a historical phase, the circuit-design topology being composed of a plurality of topologies of subcircuits.

The building-up module 12 is used for building up a convolutional neural network for training the circuit-design topology.

The training module 13 is used for inputting the topologies of subcircuits of each category into the convolutional neural network to obtain a first feature model by training.

The output module 14 is used for inputting a being-designed circuit topology into the first feature model to obtain a circuit feature parameter.

The comparison module 15 is used for comparing the circuit feature parameter with an expected parameter and obtaining a corresponding determination result.

Further provided by an embodiment of the present application is an AI implementation system used for circuit design, which is used for implementing the foregoing embodiments and preferred embodiments, and the detailed description that has been made above will not be repeated hereinafter. As used hereinafter, the term "module" may be implemented by software, hardware or a combination there of, which has a predesignated functionality. Although the device described in the following embodiment is implemented by software preferably, implementation by hardware or a combination of software and hardware is conceivable as well.

The AI implementation system used for circuit design in the embodiment is implemented in a form of functional units, The unit is indicative of an ASIC circuit, a processor or memory that executes one or more software programs or firmware programs, and/or other devices that can provide the foregoing functionalities.

The description on further more functionalities of each of the foregoing modules is the same as the foregoing corresponding embodiment, and thus details thereof are omitted herein.

In the actual process of usage, all of the circuit-design topologies of R&D personnel in the first complete cycle of circuit design are stored by the system. All of stored circuit design diagrams are input into the training module 13 to perform an AI training, wherein on the basis of the result of the AI training, each time R&D personnel perform a circuit design, in the AI implementation system, it is determined by the comparison module 15 whether the modification on the topological structure of the circuit or on parameters thereof is reasonable, and then a result is output to R&D personnel, thereby improving the efficiency in circuit design for R&D personnel.

Figure 7:
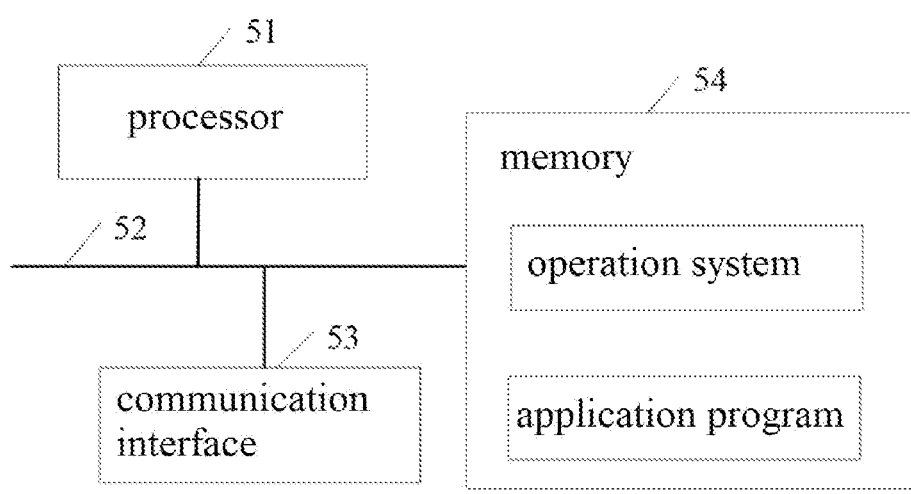
FIG. 7 is a schematic diagram of the hardware structure of an electronic device provided by an embodiment of the present application.

As shown in FIG. 7, further provided by an embodiment of the present application is an electronic device, which has the AI implementation system used for circuit design shown in FIG. 6.

Referring to FIG. 7, FIG. 7 is a structural schematic diagram of an electronic device provided by an alternative embodiment of the present application. The electronic device may include at least one processor 51, such as a CPU (Central Processing Unit), at least one communication interface 53, a memory 54 and at least one communication bus 52. The communication bus 52 is used for implementing connection and communication among these components. The communication interface 53 may include a display and a keyboard, and optionally, may further include standard wired and wireless interfaces. The memory 54 may be a high-speed RAM (Random Access Memory), i.e., a volatile RAM, and may also be a non-volatile memory, such as at least one magnetic disk memory. Alternatively, the memory 54 may also be at least one storage device that is remote from the processor 51. The processor 51 may be combined with the system described with reference to FIG. 6. The memory 54 may store an application program, and a program code stored in the memory 54 may be called by the processor 51 to perform the aforementioned AI implementation method for circuit design.

The communication bus 52 may be a peripheral component interconnect (PCI) bus or an extended industry standard architecture (EISA) bus, etc. The communication bus 52 may be categorized into an address bus, a data bus, a control bus, etc. For ease of illustration, there is merely one thick line illustrated in FIG. 7, but it does not mean there is merely one bus or one kind of bus.

The memory 54 may include a volatile memory, such as random-access memory (RAM). The memory may also include a non-volatile memory, such as a flash memory, a hard disk drive (HDD) or a solid-state drive (SSD). The memory 54 may also include a combination of the foregoing memories.

The processor 51 may be a CPU (central processing unit), a network processor (NP), or a combination of CPU and NP.

The processor 51 may further include a hardware chip. The hardware chip may be an application-specific integrated circuit (ASIC), a programmable logic device (PLD) or a combination thereof. The PLD may be a complex programmable logic device (CPLD), a field-programmable gate array (FPGA), a generic array logic (GAL) or any combination thereof.

Alternatively, the memory 54 may be further used for storing program instructions. The processor 51 may call the program instructions to implement the AI implementation method for circuit design according to the present application.

Embodiment 3

Figure 8:
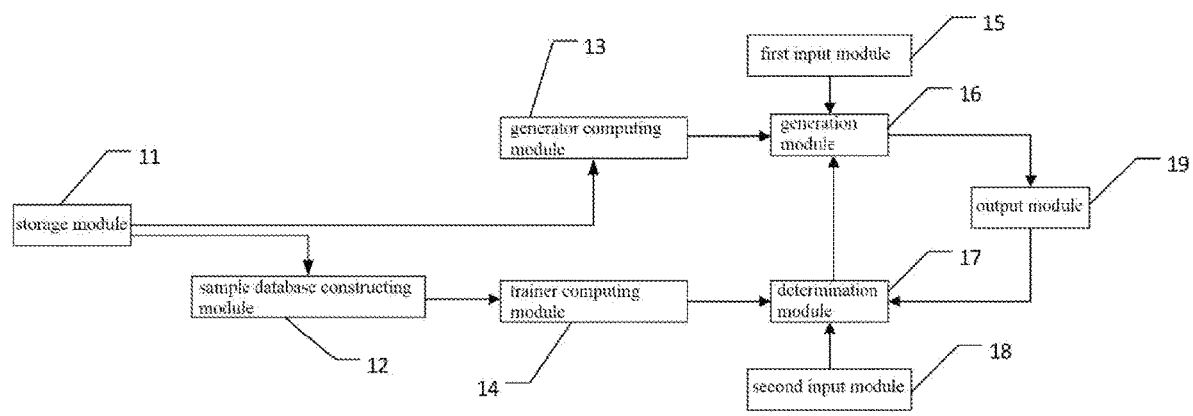
FIG. 8 is a structural block diagram of the AI implementation system used for circuit design provided by an embodiment of the present application.

As shown in FIG. 8, provided in the present application is an AI implementation system used for circuit design, which includes a storage module 11, a sample database constructing module 12, a generator computing module 13, a trainer computing module 14, a first input module 15, a generation module 16, a determination module 17, a second input module 18 and an output module 19.

The storage module 11 is used for classifying and storing topologies of subcircuits of a circuit-design topology of a historical phase. A type of the classifying is according to a functionality of each topology of subcircuit.

Specifically, in the circuit development platform, all records of modification on a circuit-design topology are automatically stored each time R&D personnel clicks on the storage button. All records of modification are automatically stored, to be specific, the code for the storage button is modified, that is, after a file is actually stored, and before the program returns to other codes, such as a code for editing and a code for closing, a line of program is inserted therein to store the netlist file corresponding to the just stored file into a code repository, thereby implementing the storage of historical versions of a file efficiently.

The sample database constructing module 12 is used for constructing, according to all of stored circuit design diagrams, a sample database and input the sample database into the trainer computing module 14, the sample database may include functional parameters of the subcircuits, a name of each circuit element of the topologies of subcircuits, and electrical connection relationships among each other of the circuit elements.

Figure 9:
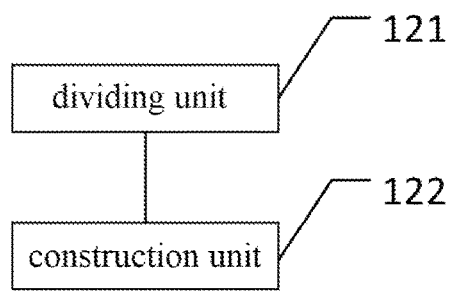
FIG. 9 is a structural block diagram for constructing a sample database module provided by an embodiment of the present application.

As shown in FIG. 9, the sample database constructing module 12 includes a dividing unit 121 and a construction unit 122.

The dividing unit 121 is used for dividing the plurality of topologies of subcircuits, and classifying the topologies of subcircuits according to functional names included in the functional parameters of the subcircuits.

The construction unit 122 is used for storing functional parameters of the subcircuits, a name of each circuit element of the topologies of subcircuits, and electrical connection relationships among each other of the circuit elements into the sample database.

A name of each circuit element of the topologies of subcircuits, and the electrical connection relationships among each other of the circuit elements are stored in the sample database in a form of a first matrix.

There is a node disposed between adjacent circuit elements, each of the circuit elements includes a connection point connected to the node. An entry $X_{ij}$ that is in an i-th row and a j-th column of the first matrix represents a circuit element $A_{abk}$ which is located between node i and node j, wherein "A" represents a type of the circuit element, "a" represents a first connection point that is connected to node i, "b" represents a second connection point that is connected to node j, and "k" represents this element is a k-th type A element.

Figure 10:
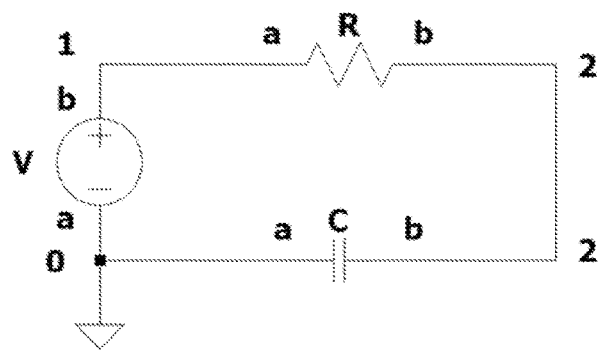
FIG. 10 is a circuit diagram of a topology of subcircuit provided by an embodiment of the present application.

As shown in FIG. 10, for example, in an RC circuit topology which contains a voltage source, each node of the subcircuit in the drawing is numbered. The node at the grounding of the subcircuit is node 0 by default. The numbering is started from node 1 rather than node 0 when there is no grounding. Node numbers are used as the row numbers and the column numbers in the matrix to create a table, then the table is filled with all of the elements to obtain the first matrix, thereby being able to link the actual electrical connection relationships in the circuit to the first matrix.

TABLE 3 a storage table of the first matrix

| node number | 0 | 1 | 2 |
|---|---|---|---|
| 0 | 0 | $V_{ab1}$ | $C_{ab1}$ |
| 1 | $V_{ba1}$ | 0 | $R_{ab1}$ |
| 2 | $C_{ba1}$ | $R_{ba1}$ | 0 |

In the table, the entry of $X_{10}$ is $V_{ba1}$ which represents a circuit element V that is located between node 1 and node 0, wherein the connection point b of the circuit element V is connected to node 1, the connection point a of the circuit element V is connected to node 0, and the number of times a circuit element appears in the circuit is assumed to be 1 by default.

In an embodiment, an entire designing process of one circuit-design topology is a designing cycle. The designing cycle includes a plurality of successive sub-designing phase. Typically, the sub-designing phases are numbered in chronological order, i.e., 1 to n, so as to labeling a subcircuit in different sub-designing phases.

The sample database further includes a second matrix. The second matrix is used for storing subcircuits in the circuit-design topology. For an entry Y that is in an m-th row and an n-th column of the second matrix, the m-th row represents a serial number corresponding to a circuit name of a certain subcircuit, the n-th column represents a sub-designing phase of a subcircuit, and a value of Y is 0 or 1 wherein 0 represents that a circuit topology of the certain subcircuit is identical to a previously stored topology of subcircuit while 1 represents that the functional parameter of the circuit topology of the certain subcircuit is different from that of the previously stored topology of subcircuit. The circuit name of a subcircuit is a functional name.

TABLE 4 a storage table of the second matrix

|   | 0 | 1 | 2 | ... | 192 | 193 | 194 | ... | n − 1 | n |
|---|---|---|---|-----|-----|-----|-----|-----|-------|---|
| 1 | 1 | 1 | 1 | ... | 0 | 1 | 0 | ... | 0 | 0 |
| 2 | 0 | 0 | 0 | ... | 1 | 1 | 1 | ... | 0 | 0 |
| ... | ... | ... | ... | ... | ... | ... | ... | ... | ... | ... |
| m | 0 | 0 | 0 | ... | 0 | 0 | 0 | ... | 0 | 0 |

In TABLE 4, Row 1 to Row m respectively represent functional names of different subcircuits, for example, the first row represents a bandgap reference voltage source, the second row represents an oscillator, the m-th row represents a top layer connection, n is the total number of the stored sub-designing phases of the entire circuit-design topology. A new topology of subcircuit may appear each time a cycle of design is finished, accordingly, in order to guarantee the integrity of data, after the complete circuit-design topology within the second cycle of design is stored, then, the first matrix is updated according to the complete circuit-design topology within the second cycle of design, a new functional name of a subcircuit in the complete circuit-design topology within the second cycle of design is updated into the second matrix, the updated first and second matrices are input into the trainer computing module to perform a retraining, and the determination module is updated, wherein the process is applicable to the succeeding cycles likewise.

The functional parameters further include a design phase of the circuit design, a range of an input voltage, a range of an output voltage, a temperature-dependent drift rate of the output voltage, a voltage drift rate of the output voltage and a static operating current or an output frequency, etc.

The generator computing module 13, is used for performing, according to all of stored circuit design diagrams, an AI training to obtain a circuit generation model.

The trainer computing module 14 is used for performing, according to all of stored circuit design diagrams, an AI training to obtain a determination model. Specifically, the AI training is performed on the basis of a sample database to obtain a determination model.

Figure 11:
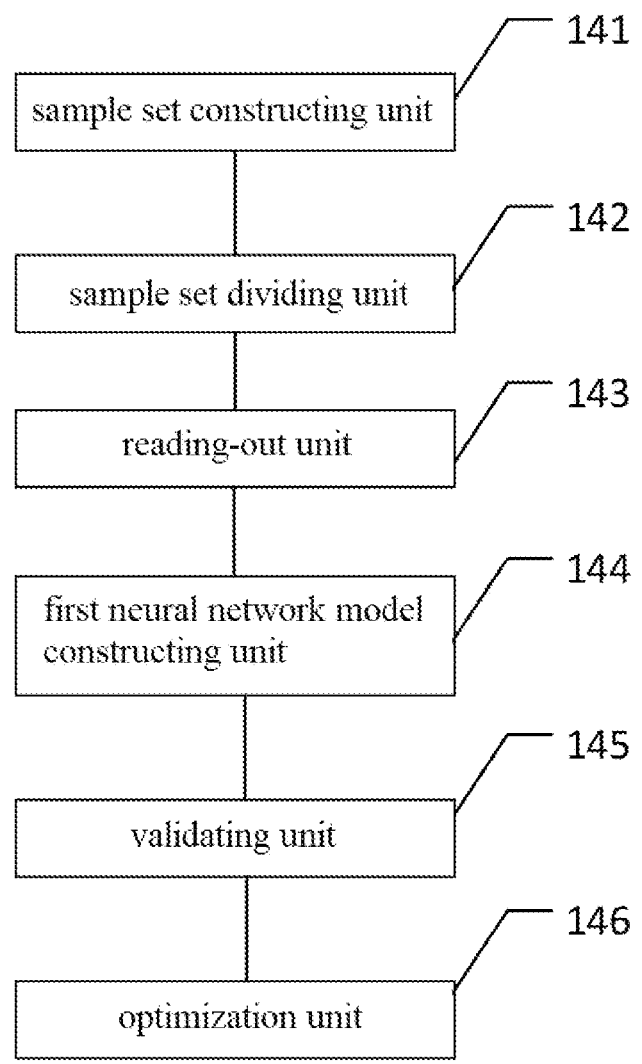
FIG. 11 is a structural block diagram of a trainer computing module provided by an embodiment of the present application.

As shown in FIG. 11, the trainer computing module 14 includes a sample set constructing unit 141, a sample set dividing unit 142, a reading-out unit 143, a first neural network model constructing unit 144, a validating unit 145 and an optimization unit 146.

The sample set constructing unit 141 is used for constructing a sample set according to the sample database.

The sample set dividing unit 142 is used for dividing the sample set randomly into a training sample subset and a testing sample subset.

The reading-out unit 143 is used for reading out data in the training sample subset and inputting the training sample subset into a neural network to perform a training operation.

The first neural network model constructing unit 144 is used for adjusting, in a training process, a network parameter weight of the neural network to obtain a first neural network model that has been trained.

The validating unit 145 is used for inputting the testing sample subset into the first neural network model to perform a validation operation so as to obtain a validation result.

Figure 12:
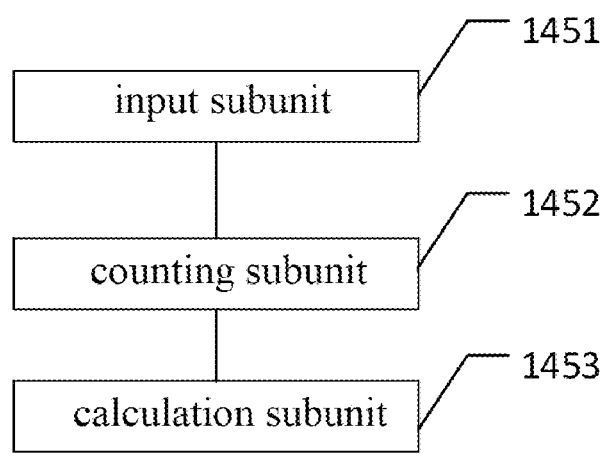
FIG. 12 is a structural block diagram of a validating unit provided by an embodiment of the present application.

As shown in FIG. 12, the validating unit 145 includes an input subunit 1451, a counting subunit 1452 and a calculation subunit 1453.

The input subunit 1451 is used for inputting x testing samples into the first neural network model to acquire x first results.

The counting subunit 1452 is used for comparing the x first results with the x testing samples, and counting an amount y of samples having an absolute value of a difference between the corresponding first result and the functional parameter of the testing sample being greater than a threshold value.

The calculation subunit 1453 is used for calculating a first validation result. The first validation result is a ratio of the amount y to the total amount x of the testing samples.

The optimization unit 146 is used for optimizing the first neural network model according to the validation result to obtain the determination model.

The first input module 15 is used for inputting a being-designed circuit design diagram and a first target functional parameter.

The generation module 16 is used for acquiring the being-designed circuit design diagram and the first target functional parameter, and obtaining, on the basis of the circuit generation model, a first target circuit design diagram, thereby being able to provide a reference to R&D personnel, and accordingly improving the efficiency in design as well as the accuracy of design.

The second input module 18 is used for inputting a second target functional parameter. Numerical values of the first target functional parameter and the second target functional parameter are equal. The first target functional parameter and the second target functional parameter may each include a range of an input voltage, a range of an output voltage, a temperature-dependent drift rate of the output voltage, a voltage drift rate of the output voltage and a static operating current or an output frequency, etc.

The determination module 17 is used for acquiring the first target circuit design diagram and the second target functional parameter, performing, on the basis of the determination model, a determination with regard to the first target circuit design diagram and the second target functional parameter, and then obtaining a first result, generating a training instruction and outputting the training instruction into the generation module 16, for retraining the circuit generation model by the generation module 16.

Specifically, the first target circuit design diagram is input into the determination model to obtain a corresponding functional parameter, the corresponding functional parameter is compared with the second target functional parameter, when the value of difference therebetween is greater than the threshold value, the first target circuit design diagram is determined to not meet the requirement in design, and a backward training instruction is generated. When the value of difference is less than the threshold value, the first target circuit design diagram is determined to meet the requirement in design, a foreword training instruction is generated, finally, the training instruction is acquired by the generation module 16 and a retraining is performed by the generation module 16 on the circuit generation model on the basis of the training instruction. No simulation is required for the retraining, and therefore the speed of training is fast.

The output module 19 is used for outputting the first target circuit design diagram (for example, a first target circuit topology) for R&D personnel to refer to during the design, thereby improving the efficiency in design.

In the present application, subcircuits of a circuit-design topology of a historical phase, which are of different categories, are classified and stored, and are input into a generator computing module 13 and a trainer computing module 14 to respectively obtain a circuit generation model and a determination model, then a being-designed circuit-design topology and a first target functional parameter are input into the generation module 16, a first target circuit design diagram is obtained by the generation module 16 on the basis of the circuit generation model, and the first target circuit design diagram is output by an output module 19, thereby being able to provide a reference design scheme for a being-designed circuit to R&D personnel, and accordingly improving the efficiency in design.

In addition, the determination module 17 may acquire the first target circuit design diagram and a second target functional parameter, perform, on the basis of the determination model, a determination with regard to the first target circuit design diagram and the second target functional parameter, and then obtain a first result and generate a training instruction and output the training instruction into the generation module 16. The generation module 16 may perform a retraining on the circuit generation model on the basis of the training instruction. No simulation is required for the retraining, and therefore the speed of training is fast.

The specific working process of the system in the present application is as follows: firstly, the generator computing module 13 and the trainer computing module 14 perform an AI training on the basis of all of the circuit diagrams stored after the first cycle of circuit design so as to obtain the circuit generation model and the determination model.

In the first sub-designing phase of the second cycle of circuit design, firstly, the being-designed circuit diagram and the first target functional parameter are input, by R&D personnel, into the generation module to obtain the first target circuit design diagram which is output to R&D personnel and the determination module via the output module, R&D personnel perform a circuit design in reference with the first target circuit design diagram to obtain the first entire design diagram. Meanwhile, the determination module acquires the second target functional parameter and the first target circuit design diagram, and performs a determination on the basis of the determination model, the determination module generates a training instruction according to the result of the determination and output the training instruction to the generation module, and the generation module performs a retraining on the circuit generation model.

In the second sub-designing phase of the second cycle of circuit design, firstly, the first entire design diagram and the first target functional parameter are input, the generation module obtains the second target circuit design diagram, the second target circuit design diagram is input to R&D personnel and the determination module via the output module, R&D personnel perform a circuit design in reference with the second target circuit design diagram to obtain the second entire design diagram. Meanwhile, the determination module acquires the second target functional parameter and the second target circuit design diagram, and performs a determination on the basis of the determination model, the determination module generates a training instruction according to the result of the determination and output the training instruction to the generation module, and the generation module performs a retraining on the circuit generation model. Further, trainings in the third and the succeeding sub-designing phases may be proceeded likewise.

As used in the present embodiment, the term "module" may be implemented by software, hardware or a combination there of, which has a predesignated functionality. Although the device described in the following embodiment is implemented by software preferably, implementation by hardware or a combination of software and hardware is conceivable as well.

The AI implementation system used for circuit design in the embodiment is implemented in a form of functional units, The unit is indicative of an ASIC circuit, a processor or memory that executes one or more software programs or firmware programs, and/or other devices that can provide the foregoing functionalities.

Embodiment 4

Figure 13:
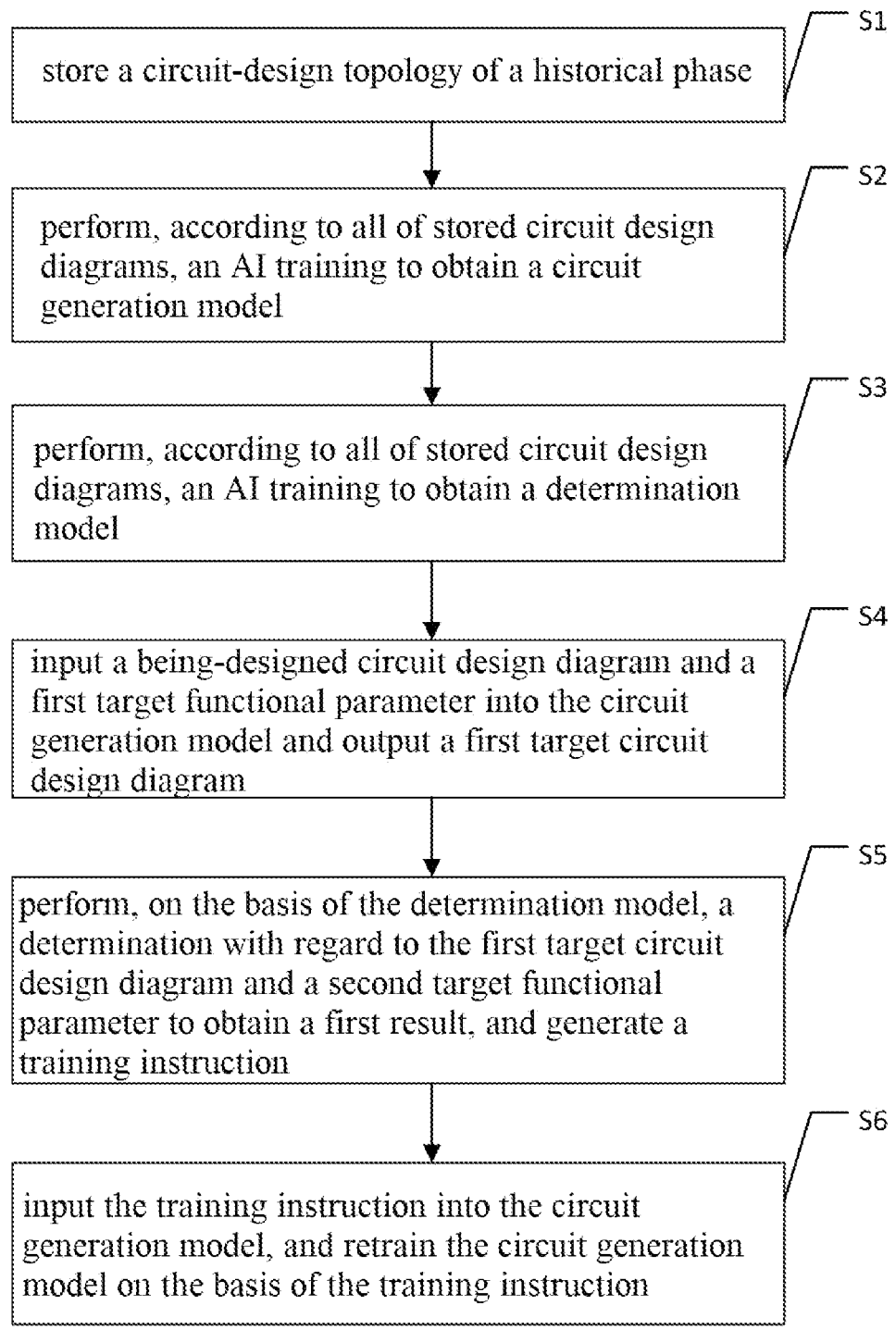
FIG. 13 is a flowchart of an AI implementation method for circuit design provided by an embodiment of the present application.

As shown in FIG. 13, provided in the present application is an AI implementation method for circuit design, which includes Steps S1 to S6.

At Step S1, store a circuit-design topology of a historical phase. The circuit-design topology is composed of a plurality of topologies of subcircuits.

At Step S2, perform, according to all of stored circuit design diagrams, an AI training to obtain a circuit generation model.

At Step S3, perform, according to all of stored circuit design diagrams, an AI training to obtain a determination model.

At Step S4, input a being-designed circuit design diagram and a first target functional parameter into the circuit generation model and output a first target circuit design diagram, thereby providing a reference to R&D personnel, and accordingly improving the efficiency in design.

At Step S5, perform, on the basis of the determination model, a determination with regard to the first target circuit design diagram and a second target functional parameter to obtain a first result, and generate a training instruction.

At Step S6, input the training instruction into the circuit generation model, and retrain the circuit generation model on the basis of the training instruction.

Provided in the present application is an AI implementation method for circuit design. in the present application, subcircuits of a circuit-design topology of a historical phase, which are of different categories, are classified and stored, an AI training is performed to respectively obtain a circuit generation model and a determination model, and then a being-designed circuit-design topology and a first target functional parameter are input into the circuit generation model to output a first target circuit design diagram, thereby being able to provide a reference design scheme for a being-designed circuit to R&D personnel, and accordingly improving the efficiency in design.

In addition, the first target circuit design diagram and a second target functional parameter may be input into the determination model, a determination with regard to the first target circuit design diagram and the second target functional parameter may be performed to obtain a first result, thereby a training instruction may be generated, and then the circuit generation model may be retrained on the basis of the training instruction, wherein no simulation is required for the retraining, and therefore the speed of training is fast.

Embodiment 5

Further provided by an embodiment of the present application is an electronic device which has the AI implementation system used for circuit design shown in FIG. 8, FIG. 9, FIG. 11 and FIG. 12.

Figure 14:
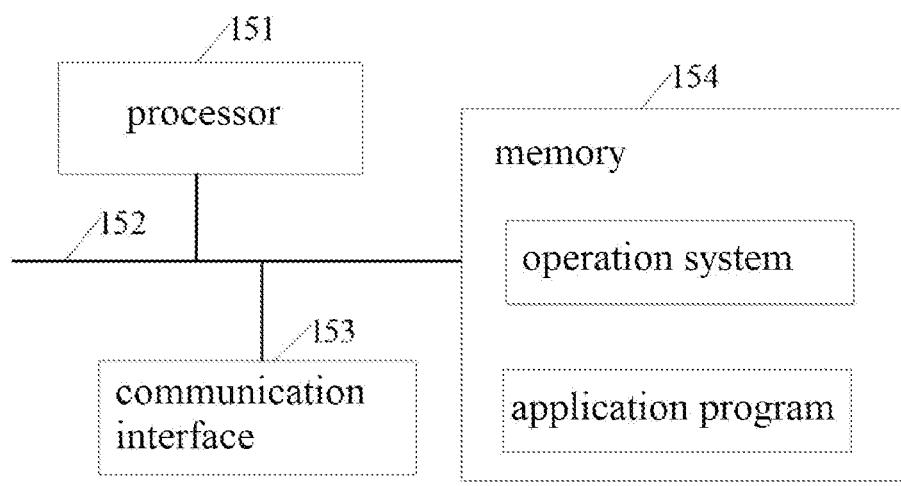
FIG. 14 is a schematic diagram of the hardware structure of an electronic device provided by another embodiment of the present application.

Referring to FIG. 14, FIG. 14 is a structural schematic diagram of an electronic device provided by an alternative embodiment of the present application. The electronic device may include at least one processor 151, such as a CPU (Central Processing Unit), at least one communication interface 153, a memory 154 and at least one communication bus 152. The communication bus 152 is used for implementing connection and communication among these components. The communication interface 153 may include a display and a keyboard, and optionally, may further include standard wired and wireless interfaces. The memory 154 may be a high-speed RAM (Random Access Memory), i.e., a volatile RAM, and may also be a non-volatile memory, such as at least one magnetic disk memory. Alternatively, the memory 154 may also be at least one storage device that is remote from the processor 151. The processor 151 may be combined with the system described in EMBODIMENT 3. The memory 154 may store an application program, and a program code stored in the memory 154 may be called by the processor 151 to perform the steps of the aforementioned AI implementation method for circuit design.

The communication bus 152 may be a peripheral component interconnect (PCI) bus or an extended industry standard architecture (EISA) bus, etc. The communication bus 152 may be categorized into an address bus, a data bus, a control bus, etc. For ease of illustration, there is merely one thick line illustrated in FIG. 14, but it does not mean there is merely one bus or one kind of bus.

The memory 154 may include a volatile memory, such as random-access memory (RAM). The memory may also include a non-volatile memory, such as a flash memory, a hard disk drive (HDD) or a solid-state drive (SSD). The memory 154 may also include a combination of the foregoing memories.

The processor 151 may be a CPU (central processing unit), a network processor (NP), or a combination of CPU and NP.

The processor 151 may further include a hardware chip. The hardware chip may be an application-specific integrated circuit (ASIC), a programmable logic device (PLD) or a combination thereof. The PLD may be a complex programmable logic device (CPLD), a field-programmable gate array (FPGA), a generic array logic (GAL) or any combination thereof.

Alternatively, the memory 154 may be further used for storing program instructions. The processor 151 may call the program instructions to implement the AI implementation method for circuit design according to the present application.

Further provided by an embodiment of the present application is a non-transient computer storage medium. Computer-executable instructions are stored in the computer storage medium. The computer-executable instructions may perform the AI implementation method for circuit design of any one of the foregoing method embodiments. The storage medium may be a magnetic disk, an optical disk, a read-only memory (ROM), a random access memory (RAM), a flash memory, a hard disk drive (HDD) or a solid-state drive (SSD), etc. The storage medium may further include a combination of the foregoing types of memories.

Although the description of embodiments of the present application has been presented by reference to the accompanying drawings, various changes and modifications can be performed by those skilled in the art without departing from the gist and scope of the present application, which shall all be included within the scope that is delimited by the appended claims.

What is claimed is:

1. An Artificial Intelligence (AI) implementation method for circuit design, comprising:

acquiring a circuit-design topology of a historical phase, the circuit-design topology being composed of a plurality of topologies of subcircuits;

building up a convolutional neural network for training the circuit-design topology;

constructing a sample database, the sample database comprising functional parameters of the subcircuits, a name of each circuit element of the topologies of subcircuits, and connection relationships among each other of the circuit elements;

inputting the sample database into the convolutional neural network to obtain a first feature model by training;

inputting a being-designed circuit topology into the first feature model to obtain a circuit feature parameter; and comparing the circuit feature parameter with an expected parameter and obtaining a corresponding determination result.

2. The AI implementation method for circuit design according to claim 1, wherein the constructing a sample database specifically comprises:

dividing the circuit-design topology into the plurality of topologies of subcircuits, and classifying the plurality of topologies of subcircuits according to functional names comprised in the functional parameters of the subcircuits; and storing the functional parameters of the subcircuits, the name of each circuit element of the topologies of subcircuits, and the connection relationships among each other of the circuit elements into the sample database.

3. The AI implementation method for circuit design according to claim 2, wherein the functional parameters further comprise a design phase of the circuit design, a range of an input voltage, a range of an output voltage, a temperature-dependent drift rate of the output voltage, a voltage drift rate of the output voltage and a static operating current or an output frequency.

4. The AI implementation method for circuit design according to claim 2, wherein data in the sample database is acquired and inputted into the convolutional neural network to obtain the first feature model by training, which specifically comprises:

constructing a sample set according to the sample database;

dividing the sample set randomly into a training sample subset and a testing sample subset;

reading out data in the training sample subset, and inputting the training sample subset into the convolutional neural network in several batches to perform a training operation;

adjusting, in a training process, a network parameter weight of the convolutional neural network to obtain a first neural network model that has been trained;

inputting the testing sample subset into the first neural network model to perform a validation operation so as to obtain a validation result; and optimizing the first neural network model according to the validation result to obtain the first feature model.

5. The AI implementation method for circuit design according to claim 4, wherein the inputting the testing sample subset into the first neural network model to perform a validation operation so as to obtain a validation result specifically comprises:

inputting x testing samples into the first neural network model to acquire x first results;

comparing the x first results with functional parameters of the x testing samples, counting an amount y of samples having an absolute value of a difference between the corresponding first result and the functional parameter of the testing sample being greater than a threshold value; and calculating the validation result, the validation result being a ratio of the amount y to the total amount x of the testing samples.

6. The AI implementation method for circuit design according to claim 1, wherein the name of each circuit element of the topologies of subcircuits and the connection relationships among each other of the circuit elements are stored in the sample database in a form of a first matrix; and wherein there is a node disposed between adjacent circuit elements, each of the circuit elements comprising a connection point connected to the node; and an entry $X_{ij}$ that is in an i-th row and a j-th column of the first matrix represents a circuit element $A_{abk}$ which is located between node i and node j, "A" representing a type of the circuit element, "a" representing a first connection point that is connected to node i, "b" representing a second connection point that is connected to node j, and "k" representing this element is a k-th type A element.

7. The AI implementation method for circuit design according to claim 1, wherein the comparing the circuit feature parameter with an expected parameter and obtaining a corresponding determination result specifically comprises:

determining the being-designed circuit topology design to be qualified when an absolute value of a difference between the circuit feature parameter and the expected parameter is less than a parameter threshold value; and determining the being-designed circuit topology to be unqualified when an absolute value of a difference between the circuit feature parameter and the expected parameter is greater than a parameter threshold value.

8. The AI implementation method for circuit design according to claim 1, wherein:

an entire designing process of one circuit-design topology is a designing cycle;

the designing cycle comprises a plurality of successive sub-designing phases;

the sample database stores the sub-designing phases of the topologies of subcircuits, and wherein the AI implementation method for circuit design further comprises:

inputting the sub-designing phases of the topologies of subcircuits and functional names comprised in the functional parameters into the convolutional neural network to obtain a second feature model by training;

inputting a being-designed circuit topology into the second feature model to obtain a subcircuit designing phase; and comparing the subcircuit designing phase with the actual sub-designing phase to obtain a corresponding determination result.

9. The AI implementation method for circuit design according to claim 8, wherein the sub-designing phases of the topologies of subcircuits are stored in the sample database in a form of a second matrix, the second matrix being used for storing subcircuits in the circuit-design topology;

for an entry Y that is in an m-th row and an n-th column of the second matrix, the m-th row represents a serial number corresponding to a circuit name of a certain subcircuit, the n-th column represents a sub-designing phase of a subcircuit; and a value of Y is 0 or 1 wherein 0 represents that a circuit topology of the certain subcircuit is identical to a previously stored topology of subcircuit while 1 represents that the functional parameter of the circuit topology of the certain subcircuit is different from that of the previously stored topology of sub circuit.

* * * * *